(12) United States Patent
Chang et al.

(10) Patent No.: US 10,649,560 B2
(45) Date of Patent: May 12, 2020

(54) TOUCH DISPLAY PANEL

(71) Applicant: Au Optronics Corporation, Hsinchu (TW)

(72) Inventors: Che-Chia Chang, Hsinchu (TW); Ming-Hung Chuang, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 79 days.

(21) Appl. No.: 15/939,322

(22) Filed: Mar. 29, 2018

(65) Prior Publication Data

US 2019/0171308 A1 Jun. 6, 2019

(30) Foreign Application Priority Data

Dec. 6, 2017 (TW) .............................. 106142762 A

(51) Int. Cl.
| | | |
|---|---|---|
| *G06F 3/041* | (2006.01) | |
| *G06F 3/042* | (2006.01) | |
| *G06F 3/044* | (2006.01) | |
| *H01L 27/144* | (2006.01) | |
| *H01L 29/786* | (2006.01) | |
| *H01L 27/12* | (2006.01) | |

(52) U.S. Cl.
CPC .............. *G06F 3/041* (2013.01); *G06F 3/042* (2013.01); *G06F 3/0412* (2013.01); *G06F 3/0445* (2019.05); *G06F 3/04164* (2019.05); *H01L 27/1446* (2013.01); *G06F 2203/04106* (2013.01); *H01L 27/124* (2013.01); *H01L 29/78633* (2013.01)

(58) Field of Classification Search
CPC ........ G06F 3/41; G06F 3/0412; G06F 3/0445; G06F 3/042; G06F 3/04164; G06F 2203/04106; G06F 3/0416; H01L 27/1446; H01L 27/124; H01L 29/78633; G01J 1/4204
See application file for complete search history.

(56) References Cited

U.S. PATENT DOCUMENTS

| | | | |
|---|---|---|---|
| 7,682,883 B2 | 3/2010 | Cho et al. | |
| 2003/0013008 A1* | 1/2003 | Ono | H01G 9/2009 |
| | | | 429/111 |

(Continued)

FOREIGN PATENT DOCUMENTS

| | | |
|---|---|---|
| CN | 101281727 | 10/2008 |
| CN | 105514126 | 4/2016 |

(Continued)

*Primary Examiner* — Brent D Castiaux
(74) *Attorney, Agent, or Firm* — JCIPRNET

(57) ABSTRACT

A touch display panel having a display region, a peripheral region surrounding the display region, and a sensing region located between the display region and the peripheral region is provided. The touch display panel includes a pixel array, a touch electrode, an active device, at least one first sensor, at least one second sensor, and a light-shielding layer. The pixel array is located in the display region. The touch electrode located in the sensing region and the pixel array are separated from each other. The active device coupled to the touch electrode is located in the sensing region. The at least one first sensor and the at least one second sensor are located in the sensing region and separated from each other. The light-shielding layer covers the at least one first sensor.

8 Claims, 4 Drawing Sheets

(56) References Cited

U.S. PATENT DOCUMENTS

| | | | |
|---|---|---|---|
| 2009/0284517 A1 | 11/2009 | Chuang et al. | |
| 2013/0207948 A1 | 8/2013 | Na et al. | |
| 2014/0161363 A1* | 6/2014 | Sargent | G06K 9/00355 |
| | | | 382/224 |
| 2014/0232950 A1* | 8/2014 | Park | G06F 3/041 |
| | | | 349/12 |
| 2016/0118434 A1* | 4/2016 | Chang | H01L 27/1462 |
| | | | 438/72 |
| 2017/0084668 A1* | 3/2017 | Wang | G06F 3/0416 |
| 2017/0178556 A1* | 6/2017 | Wu | G06F 3/0412 |

FOREIGN PATENT DOCUMENTS

| | | |
|---|---|---|
| CN | 206147578 | 5/2017 |
| TW | I392908 | 4/2013 |

\* cited by examiner

TOUCH DISPLAY PANEL

CROSS-REFERENCE TO RELATED APPLICATION

This application claims the priority benefit of Taiwan application serial no. 106142762, filed on Dec. 6, 2017. The entirety of the above-mentioned patent application is hereby incorporated by reference herein and made a part of this specification.

BACKGROUND OF THE INVENTION

1. Field of the Invention

The invention relates to a display panel and particularly relates to a touch display panel.

2. Description of Related Art

In recent years, in order to reduce a power consumption of a display device or exhibit an image with better quality, an ambient light sensor (ALS) has been widely used in the electronic devices, such as a cell phone, a hand-held device and an image display device. For example, a tone of the display device may be adapted to human luminosity through the design of only allowing the visible light to reach the ambient light sensor.

However, the current ambient light sensor is constituted by integrated circuit chips. In order to make the ambient light sensor integrated into the display device, the design space of the display device is definitely occupied to make the display device less likely to have a narrow border, even no border, or shrink an area of a display region of the display device. Therefore, how to make the ambient light sensor integrated into the display device to allow the display device to have a narrow border, even no border, is indeed one of the issues that the current researchers attempt to address.

SUMMARY OF THE DISCLOSURE

The disclosure provides a touch display panel having a miniature design that may be integrated with an ambient light sensor with high accuracy.

The touch display panel according to the disclosure of the embodiment has a display region, a peripheral region, and a sensing region. The peripheral region surrounds the display region, and the sensing region is located between the display region and the peripheral region. The touch display panel includes a pixel array, a touch electrode, an active device, at least one first sensor, at least one second sensor and a light-shielding layer. The pixel array is located in the display region. The touch electrode located in the display region and the pixel array separated from each other. The active device is located in the sensing region and coupled to the touch electrode. The at least one first sensor and the at least one second sensor are located in the sensing region and separated from each other. The light-shielding layer covers the at least one first sensor.

In view of the foregoing, since the touch display panel according to the disclosure of the embodiments includes the first sensor and second sensor that are located in the sensing region, and the light-shielding layer covers the first sensor, the ambient light is prevented from being irradiated to the first sensor. In this regard, the first sensor and the second sensor may collect a dark current value (i.e. current obtained in the case that the ambient light is not irradiated to the first sensor) and a bright current value (i.e. current obtained in the case that the ambient light is irradiated to the second sensor), and impacts caused by the dark current effect and temperature effect are eliminated through calculating the obtained dark and bright current values, so that the accuracy of the ambient light sensor can be increased.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
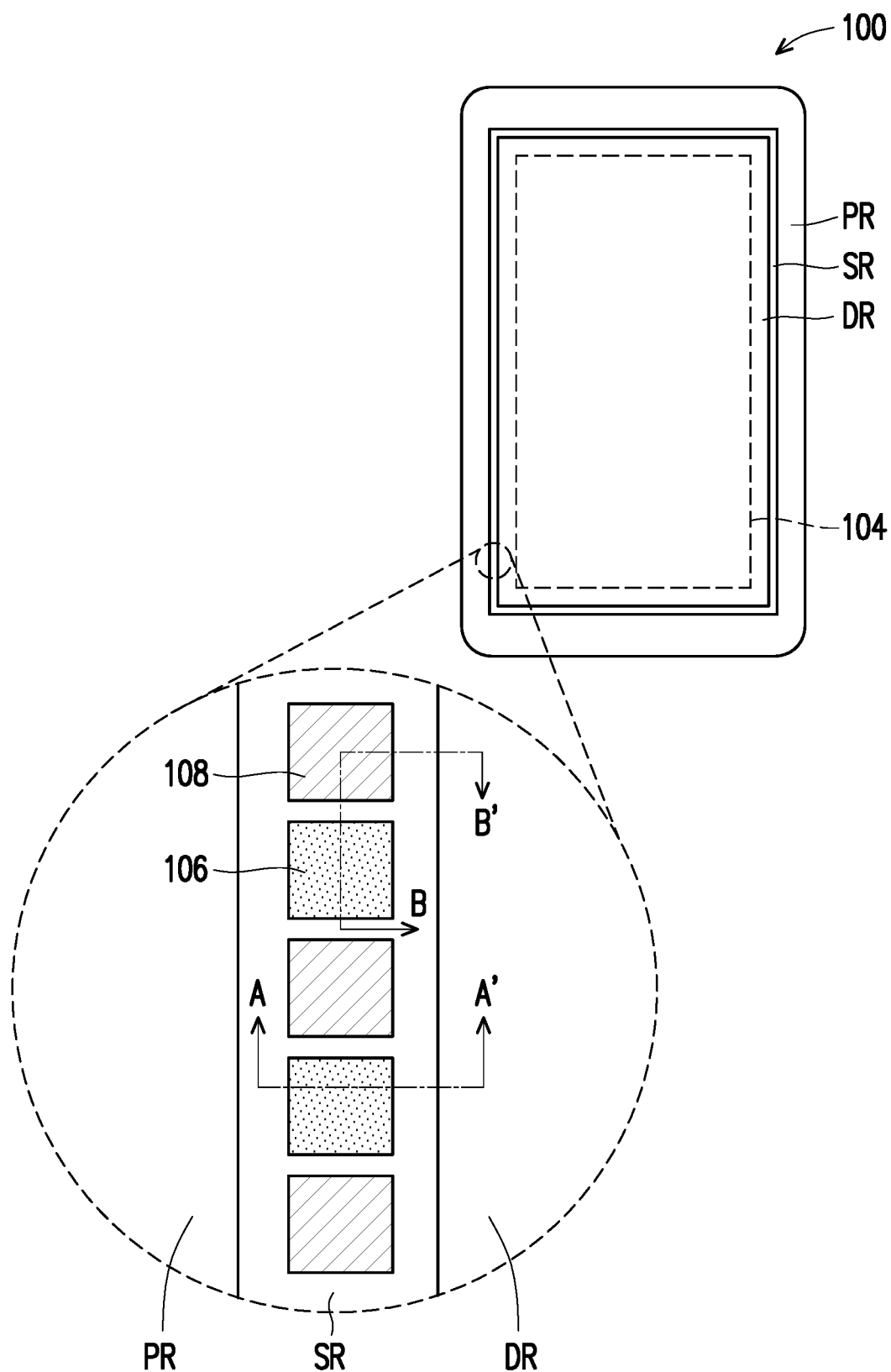
FIG. 1 is a top view of a touch display panel according to an embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

The disclosure is described more thoroughly in the drawings of embodiments. However, the disclosure may also be demonstrated in different forms and is not limited to the embodiments recited throughout the text. Thicknesses of a layer and region in the drawings are enlarged to be recognizable. An identical or similar reference numeral denotes an identical or similar element. No further details are provided in the following paragraph. In addition, terms about the direction mentioned in the embodiments, such as upward, downward, left, right, front or back, merely represent the direction of accompanying drawings. Therefore, the used terms about the direction are meant to provide explanations rather than limit the disclosure.

Figure 2:
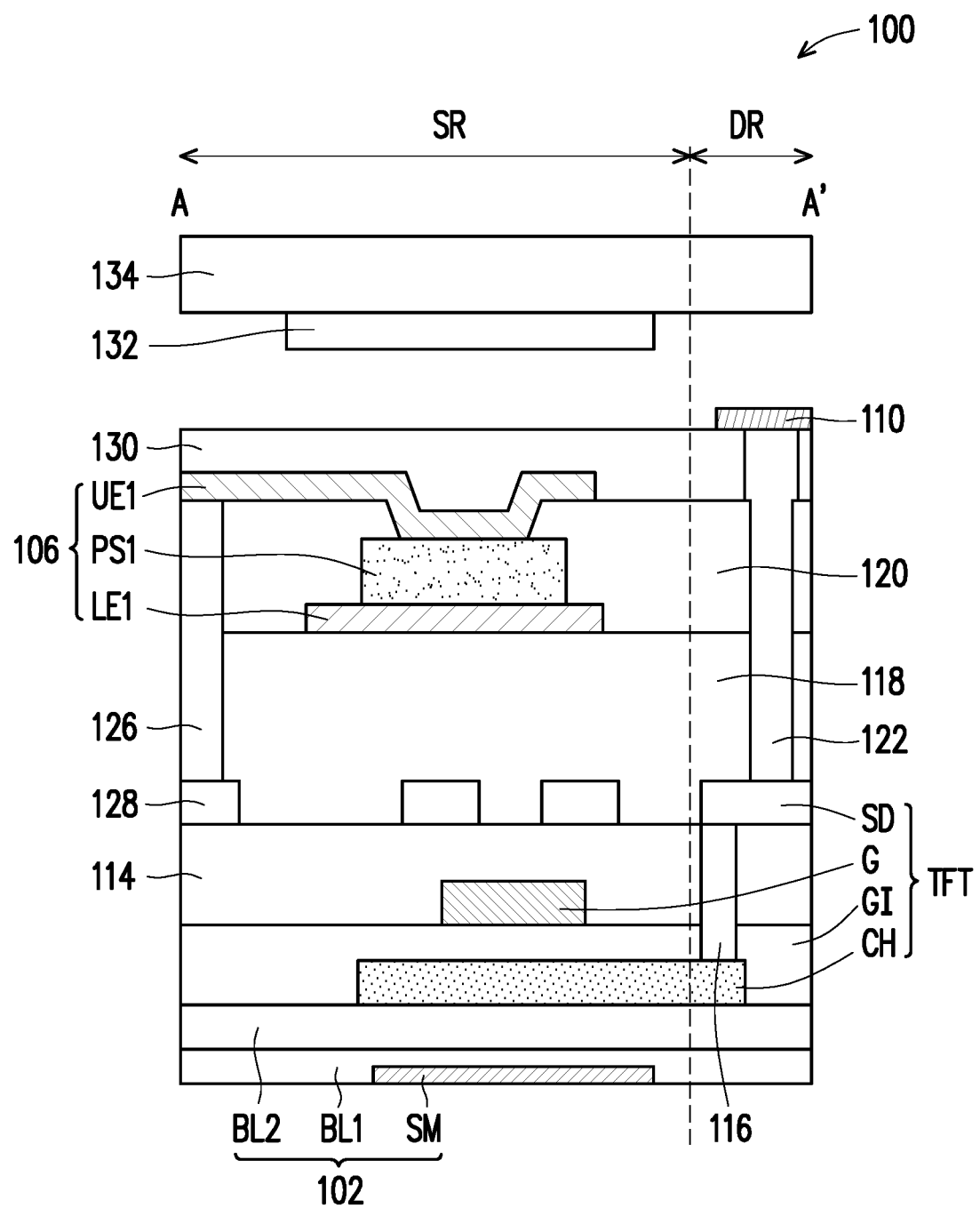
FIG. 2 is a cross-sectional view taken along line A-A' of FIG. 1.
Figure 3:
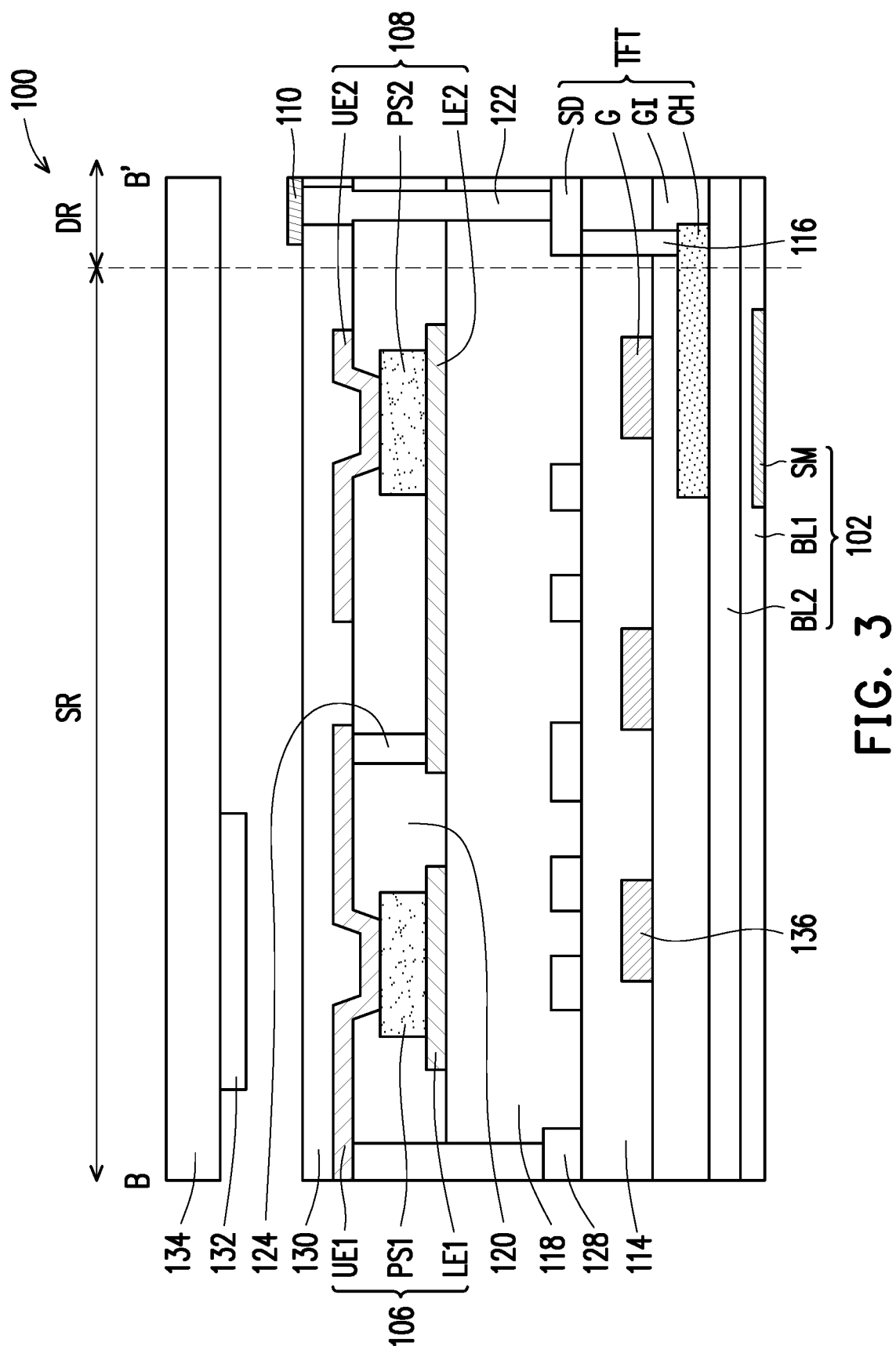
FIG. 3 is a cross-sectional view taken along line B-B' of FIG. 1.

FIG. 1 is a top view of a touch display panel according to an embodiment of the disclosure. In order to clearly show positions of a first sensor 106 and a second sensor 108 in a touch display panel 100, other components in a sensing region SR are not illustrated in FIG. 1. FIG. 2 is a cross-sectional view taken along a line A-A' of FIG. 1. FIG. 3 is a cross-sectional view taken along a line B-B' of FIG. 1.

Referring to FIGS. 1, 2 and 3, the touch display panel 100 has a display region DR, a peripheral region PR and the sensing region SR. The peripheral region PR surrounds the display region DR, and the sensing region SR is located between the display region DR and the peripheral region PR. The display region DR represents a region where images are displayed, the peripheral region PR represents a region where images are not displayed or peripheral circuits are disposed, and the sensing region represents a region where a sensor (such as a photodetector capable of detecting the intensity of ambient light) is disposed.

The touch display panel 100 includes a substrate 102, an active device TFT, a pixel array 104, at least one first sensor 106, at least one second sensor 108, a touch electrode 110 and a light-shielding layer 132.

The substrate 102 may include a first buffer layer BL1, a second buffer layer BL2 and a shielding layer SM. The second buffer layer BL2 is located on the first buffer layer BL1, and the shielding layer SM is located in the first buffer layer BL1. A material of the first buffer layer BL1 may be silicon nitride (SiNx), a material of the second buffer layer BL2 may be silicon oxide (SiOx), and a material of the shielding layer SM may be a non-transparent material, such as a material with lower reflectivity like a black resin and shielding metal (chromium, for example). In this regard, in the case that the touch display panel 100 includes a backlight source, the shielding layer SM may prevent the light of the backlight source from being irradiated to the active device TFT to cause the problem of leakage current. In some embodiments of the disclosure, the substrate 102 may further include a glass substrate, a quartz substrate or organic polymer substrate to support the first buffer layer BL1, the second buffer layer BL2 and the shielding layer SM.

The active device TFT is located on the substrate 102 in the sensing region SR and may be bottom-gate or top-gate thin-film transistors, including a channel layer CH, a gate insulator layer GI, a gate G and a source/drain SD. In the present embodiment of the disclosure, the active device TFT is a top-gate thin-film transistor, but the disclosure is not limited thereto.

The channel layer CH is located on the second buffer layer BL2. A material of the channel layer CH is, for example, amorphous silicon, microcrystalline silicon, monocrystalline silicon, an organic conductor material, an oxide conductor material or other appropriate materials. In some embodiments of the disclosure, dopants may be provided on opposite sides of the channel layer CH to form a source contact region (not illustrated) configured to be connected to a source and a drain contact region (not illustrated) configured to be connected to a drain. In addition, in some embodiments of the disclosure, an ohmic contact layers (not illustrated) having N-type doping or P-type doping may further be formed on the channel layer CH to reduce the contact resistance between the channel layer CH and the source/drain SD.

The gate insulator layer GI is located on the second buffer layer BL2 and covers the channel layer CH. A material of the gate insulator layer GI may be an inorganic dielectric material, an organic dielectric material or a combination thereof. For example, the inorganic material may be silicon oxide, silicon nitride, silicon oxynitride or a combination thereof. The organic material may be polymer materials like polyimide-based resin, epoxy-based resin or acrylic-based resin. The gate G is located on the gate insulator layer GI, and a material of the gate G may be a conductive material, such as metal, metal oxide, metal nitride, metal oxynitride or a combination thereof. A dielectric layer 114 is located on the gate insulator layer GI and covers the gate G. A material of the dielectric layer 114 may be an inorganic dielectric material, an organic dielectric material or a combination thereof. For example, the inorganic material may be silicon oxide, silicon nitride, silicon oxynitride or a combination thereof. The organic material may be polymer materials like polyimide-based resin, epoxy-based resin or acrylic-based resin. In some embodiments of the disclosure, the dielectric layer 114 is an interlayer dielectric layer (ILD), but the disclosure is not limited thereto.

The source/drain SD is located on the dielectric layer 114, and a material of the source/drain SD may be a conductive material, such as metal, metal oxide, metal nitride, metal oxynitride or a combination thereof. The source/drain SD may be connected to the channel layer CH through a contact 116. For example, the source/drain SD may be connected to the source contact region or the drain contact region of the channel layer CH through the contact 116 that penetrates the dielectric layer 114 and a portion of the gate insulator layer GI. A material of the contact 116 may be a conductive material, such as metal, metal oxide, metal nitride, metal oxynitride or a combination thereof.

The pixel array 104 is located on the substrate 102 in the display region DR. The pixel array 104 may include multiple pixel units and gate lines and data lines that are disposed in the display region DR. Each of the pixel units may include a gate line, a data line and a sub-pixel, and each of the sub-pixels may be electrically connected to one of the gate lines and one of the data lines in the pixel array 104 respectively, but the disclosure is not limited thereto. A material of the pixel electrode in the pixel array 104 may be a transparent conductive material, such as metal oxide like indium tin oxide, indium zinc oxide, aluminum tin oxide, aluminum zinc oxide or indium germanium zinc oxide.

The touch electrode 110 is located on the substrate 102 in the display region DR, and the touch electrode 110 and pixel array 104 are separated from each other. A material of the touch electrode 110 may be a conductive material, such as metal, metal oxide, a conductive polymer or a combination thereof. For example, the material of the touch electrode 110 may be indium tin oxide (ITO). In some embodiments of the disclosure, the touch electrode 110 is located on the pixel array 104. One or more insulating layers are provided between the touch electrode 110 and the pixel array 104, so that the touch electrode 110 and the pixel array 104 are separated from each other in a vertical direction. For example, a planarization layer 118 and passivation layers 120 and 130 that are disposed on the planarization layer 118 may be provided between the pixel array 104 and the touch electrode 110. In some embodiments of the disclosure, the touch electrode 110 located in the display region DR may be coupled to the active device TFT in the sensing region SR. For example, the touch electrode 110 may be coupled to the source/drain SD of the active device TFT through a contact 122 that penetrates the planarization layer 118 and the passivation layers 120 and 130. A material of the contact 122 may be a conductive material, such as metal, metal oxide, metal nitride, metal oxynitride or a combination thereof.

In some embodiments of the disclosure, the touch display panel 100 may further include a gate driver on array (GOA) driving circuit. Moreover, to allow the touch display panel 100 to have narrow border design, the gate driver on array driving circuit may be disposed in the peripheral region PR and extend to the display region DR through the sensing region SR. In this regard, the active device or a bus line of the gate driver on array driving circuit may be located in the display region DR, the sensing region SR or the peripheral region PR to realize narrow border design. That is, as shown in FIG. 3, bus lines 128 and 136 of the gate driver on array driving circuit may be located in the same layer (the bus line 128, for example) as the source/drain SD of the active device TFT or as the gate G of the active device TFT (the bus line 136, for example). In addition, in some embodiments of the disclosure, in order to simplify the manufacturing steps of the touch display panel 100, the active device used in the pixel array 104, the touch electrode 110 and the gate driver on array driving circuit may be formed in the same manufacturing process.

The planarization layer 118 is located on the dielectric layer 114 and covers the active device TFT. A material of the planarization layer 118 may be an organic insulator material, an inorganic insulator material or a combination thereof. The organic insulator material may be polyimide (PI), polyamic acid (PAA), polyamide (PA), polyvinyl alcohol (PVA), polyvinyl cinnamate (PVCi), other appropriate photoresist materials or a combination thereof. The inorganic insulator material may be silicon oxide, silicon nitride, silicon oxynitride or a combination thereof. In some embodiments of the disclosure, the planarization layer 118 covers the gate driver on array driving circuit.

The passivation layer 120 covers the planarization layer 118. A material of the passivation layer 120 may be an organic insulator material, an inorganic insulator material or a combination thereof. The organic insulator material may be PI, PAA, PA, PVA, PVCi, other appropriate photoresist materials or a combination thereof. The inorganic insulator material may be silicon oxide, silicon nitride, silicon oxynitride or a combination thereof.

The first sensor 106 and the second sensor 108 are located in the sensing region SR and separated from each other. The first sensor 106 includes a first upper electrode UE1, a first lower electrode LE1, a first photosensitive layer PS1 located between the first upper electrode UE1 and the first lower electrode LE1. The second sensor 108 includes a second upper electrode UE2, a second lower electrode LE2 and a second photosensitive layer PS2 located between the second upper electrode UE2 and the second lower electrode LE2. In this regard, ambient light may be detected by measuring the photocurrent generated by the first photosensitive layer PS1 or the second photosensitive layer PS2 that is irradiated. In some embodiments of the disclosure, the first sensor 106 and the second sensor 108 are connected to the same active device. For example, the first upper electrode UE1 is electrically connected to the second lower electrode LE2 through a contact 124 (as shown in FIG. 3), and the first upper electrode UE1 and the second lower electrode LE2 are connected to an end of the same active device. A material of the contact 124 may be a conductive material, such as metal, metal oxide, metal nitride, metal oxynitride or a combination thereof. In some embodiments of the disclosure, the first sensor 106 or the second sensor 108 may be located on and overlap with the active device TFT.

Materials of the first upper electrode UE1 and the second upper electrode UE2 may be transparent conductive materials, such as metal oxide like indium tin oxide, indium zinc oxide, aluminum tin oxide, aluminum zinc oxide or indium germanium zinc oxide. Materials of the first lower electrode LE1 and the second lower electrode LE2 may be conductive materials, such as metal, metal oxide, a conductive polymer or a combination thereof. In some embodiments of the disclosure, the first lower electrode LE1 and the second lower electrode LE2 may be located in the same layer as the pixel electrode in the pixel array 104. That is, the first lower electrode LE1, the second lower electrode LE2 and the pixel electrode in the pixel array 104 may be formed in the same manufacturing process. In other words, materials of the first lower electrode LE1 and the second lower electrode LE2 may also be transparent conductive materials, such as metal oxide like indium tin oxide, indium zinc oxide, aluminum tin oxide, aluminum zinc oxide or indium germanium zinc oxide.

Materials of the first photosensitive layer PS1 and the second photosensitive layer PS2 may be photosensitive materials, such as silicon rich oxide (SRO), amorphous silicon (a-Si) or a combination thereof, but the disclosure is not limited thereto. Whichever material generates photocurrent after being irradiated light may serve as a material of the first photosensitive layer PS1 or the second photosensitive layer PS2.

As shown in FIG. 3, the first upper electrode UE1 and the second upper electrode UE2 may be connected to the first photosensitive layer PS1 and the second photosensitive layer PS2 respectively. Moreover, the first upper electrode UE1 or the second upper electrode U2 may be located on a surface of the passivation layer 120 and extend into the passivation layer 120. In some embodiments of the disclosure, the first photosensitive layer PS1 and the second photosensitive layer PS2 are located on the planarization layer 118, and the first lower electrode LE1 or the second lower electrode LE2 is also located on the planarization layer 118. That is, the first sensor 106 and the second sensor 108 are located on the planarization layer 118 and cover the gate driver on array driving circuit. In this regard, the sensing region SR overlaps with a portion of the peripheral region PR, so additional space is not required for the first sensor 106 and the second sensor 108 to allow the touch display panel 100 to have narrow border design. In some embodiments of the disclosure, the first upper electrode UE1 or the second upper electrode UE2 is connected to the gate driver on array driving circuit. For example, the first upper electrode UE1 may be connected to the bus line 128 of the gate driver on array driving circuit through a contact 126. In some embodiments of the disclosure, the bus line 128 may be in the same layer as the source/drain SD. It should be noted that, the embodiments described above, that the first upper electrode UE1 or the second upper electrode UE2 is located in the passivation layer 120 represents the relative positions of the first upper electrode UE1, the second upper electrode UE2 and the passivation layer 120. The first upper electrode UE1 or the second upper electrode UE2 is not limited to be surrounded or covered by the passivation layer 120.

The passivation layer 130 is located on the passivation layer 120 and covers the first upper electrode UE1 and the second upper electrode UE2. A material of the passivation layer 130 may be silicon oxide, silicon nitride, silicon oxynitride or a transparent organic material (such as polycarbonate, polyester, polymethylmethacrylate or cyclic olefin copolymer). In some embodiments of the disclosure, the passivation layer 130 located in the display region DR may serve as touch capacitance. For example, the passivation layer 130 is located between a sensing electrode (Rx) and a drive electrode (Tx) in the touch electrode 110. That is, one of the sensing electrode and the drive electrode is located on the passivation layer 120 (in the same layer as the first upper electrode UE1 or the second upper electrode UE2, for example), and the other of the sensing electrode and the drive electrode is located on a surface of the passivation layer 130.

The light-shielding layer 132 covers the first sensor 106, but not the second sensor 108. That is, ambient light is merely irradiated to the second sensor 108, but not the first sensor 106. In this regard, the first sensor 106 and the second sensor 108 may collect a dark current value $I_{dark}$ (i.e. photocurrent obtained when ambient light is not irradiated to the first sensor 106) and a bright current value $I_{photo}$ (i.e. photocurrent obtained when ambient light is irradiated to the second sensor 108) respectively, and impacts caused by the dark current effect and the temperature effect are eliminated through calculating the obtained dark and bright current values (such as $I_{photo}-I_{dark}$), so that the accuracy of an ambient light sensor can be increased (i.e. reducing the interference by a background current value). A material of the light-shielding layer 132 may be a non-transparent material, such as a material with lower reflectivity like a black resin and shielding metal. In some embodiments of the disclosure, the light-shielding layer 132 overlaps with the first photosensitive layer PS1.

In addition, according to an embodiment of the disclosure, in order to detect the ambient light in all brightness ranges (0 lux to 55,000 lux), a total of the photocurrent values may be raised by increasing the number of the first sensor 106 and the second sensor 108 to make the touch display panel suitable for the low-brightness environment (with brightness of 1 lux, for example) and the high-brightness environment (with brightness 50,000 lux under strong sunlight, for example). It should be noted that, a total area of the second sensor 108 irradiated by the ambient light needs to be larger than or equal to 1 mm$^2$ to accurately detect the ambient light in all brightness ranges. In some embodiments of the disclosure, as shown in FIG. 1, the plurality of first sensors 106 and the plurality of second sensors 108 are equally disposed around the display region DR in an alternating manner. In this regard, since each of the first sensors 106 and each of the second sensors 108 have miniature sizes (an area of approximately 0.0004 mm$^2$), a user has difficulties perceiving the second sensor 108 despite a transparent region or transparent hole (allowing the ambient light to be irradiated to the second sensor 108) on the second sensor 108. Therefore, the touch display panel 100 has a good appearance.

In some embodiments of the disclosure, the touch display panel 100 further includes a protection layer 134 covering the light-shielding layer 132 and the passivation layer 130. The protection layer 134 may be made of a transparent material, such as glass.

Figure 4:
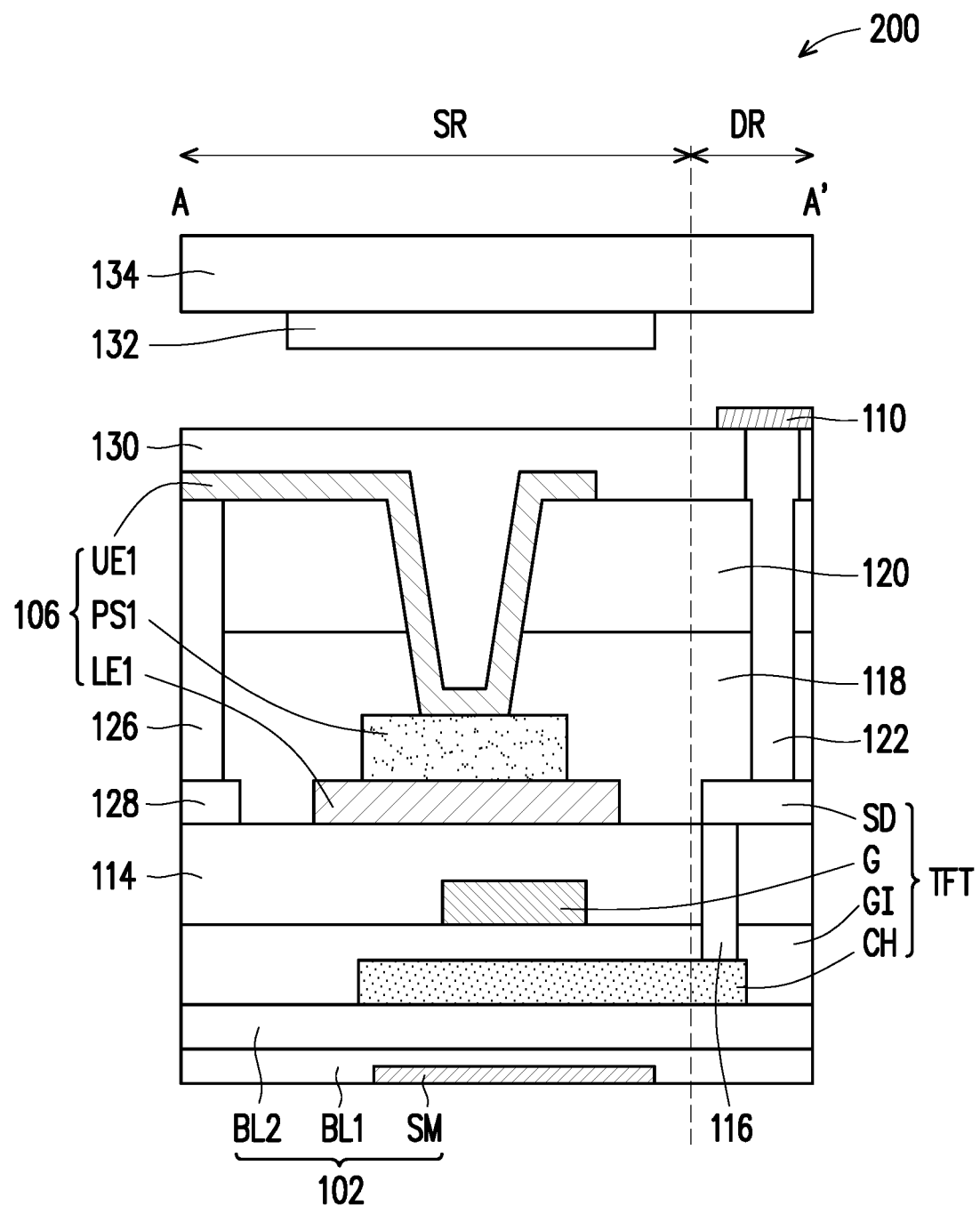
FIG. 4 is a cross-sectional view of a touch display panel according to another embodiment of the disclosure.

FIG. 4 is a cross-sectional view of a touch display panel according to another embodiment of the disclosure. A touch display panel 200 is generally the same as the touch display panel 100, but different from the touch display panel 100 in that the first photosensitive layer PS1 and the second photosensitive layer PS2 are located in the planarization layer 118, and the first upper electrode UE1 and the second upper electrode UE2 are also located in the planarization layer 118. It should be noted that, the embodiments described above, that the first photosensitive layer PS1 and the second photosensitive layer PS2 are located in the planarization layer 118 represents the relative positions of the first photosensitive layer PS1, the second photosensitive layer PS2 and the planarization layer 118. The first photosensitive layer PS1 and the second photosensitive layer PS2 are not limited to be surrounded or covered by the planarization layer 118. Likewise, the embodiments described above, that the first upper electrode UE1 and the second upper electrode UE2 are located in the planarization layer 118 represents the relative positions of the first upper electrode UE1, the second upper electrode UE2 and the planarization layer 118. The first upper electrode UE1 and the second upper electrode UE2 are not limited to be surrounded or covered by the planarization layer 118.

Referring to FIG. 4, the first lower electrode LE1 or the second lower electrode LE2 is located on a surface of the dielectric layer 114. That is, the first lower electrode LE1 or the second lower electrode LE2 is in the same layer as the bus line 128 of the gate driver on array driving circuit or the source/drain SD of the active device TFT. In this regard, the first lower electrode LE1 of the first sensor 106 and the second lower electrode LE2 of the second sensor 108 may be formed along with the bus line 128 of the gate driver on array driving circuit in the same manufacturing process, so the manufacturing process is simplified. It should be noted that, based on the first upper electrode LE1 or the second lower electrode LE2 is in the same layer as the bus line 128 of the gate driver on array driving circuit, therefore, additional space (approximately 100 μm) is required for the first sensor 106 and the second sensor 108 in the present embodiment of the disclosure, so that the size of the touch display panel 200 is larger than the size of the touch display panel 100.

In view of the foregoing, since the touch display panel according to the embodiments of the disclosure includes the first sensor and the second sensor located in the sensing region, and the light-shielding layer covers the first sensor, the ambient light is prevented from being irradiated to the first sensor. In this regard, the first sensor and the second sensor may collect the dark current value and the bright current value respectively, and impacts caused by the dark current effect and the temperature effect are eliminated through calculating the obtained dark and bright current values, so that the accuracy of the ambient light sensor can be increased (i.e. reducing the interference by the background current value).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch display panel, having a display region, a peripheral region surrounding the display region, and a sensing region surrounding the display region and entirely sandwiched between the display region and the peripheral region, wherein the touch display panel comprises:
    a pixel array, located in the display region;
    a touch electrode, located in the display region, and the touch electrode and the pixel array separated from each other;
    an active device, located in the sensing region and coupled to the touch electrode;
    at least one first sensor and at least one second sensor, located in the sensing region and separated from each other, wherein the at least one first sensor and the at least one second sensor are respectively configured to detect an intensity of ambient light;
    a light-shielding layer, covering the at least one first sensor;
    a gate driver on array driving circuit, located in the peripheral region and extending to the display region through the sensing region;
    a planarization layer, covering the gate driver on array driving circuit; and
    a passivation layer, covering the planarization layer,
    wherein the at least one first sensor comprises a first upper electrode, a first lower electrode and a first photosensitive layer located between the first upper electrode and the first lower electrode; and
    the at least one second sensor comprises a second upper electrode, a second lower electrode and a second photosensitive layer located between the second upper electrode and the second lower electrode, wherein the light-shielding layer overlaps with the first photosensitive layer, wherein the first photosensitive layer and the second photosensitive layer are located in the planarization layer, and the first upper electrode and the second upper electrode are located in the planarization layer.

2. The touch display panel as claimed in claim 1, wherein the at least one first sensor or the at least one second sensor overlaps with the active device.

3. The touch display panel as claimed in claim 1, wherein the at least one first sensor comprises a plurality of first sensors, the at least one second sensor comprises a plurality of second sensors, and the first sensors and the second sensors are arranged in the sensing region alternately.

4. The touch display panel as claimed in claim 3, wherein each of the second sensors is not covered by the light-shielding layer.

5. The touch display panel as claimed in claim 1, wherein the first upper electrode is electrically connected to the second lower electrode.

6. The touch display panel as claimed in claim 5, wherein the first upper electrode and the second upper electrode are connected to the first photosensitive layer and the second photosensitive layer respectively, and the first upper electrode or the second upper electrode is located on a surface of the passivation layer and extend into the passivation layer.

7. The touch display panel as claimed in claim 1, wherein the active device comprises a source and a drain, and the first lower electrode or the second lower electrode is in the same layer as the source or the drain of the active device.

8. The touch display panel as claimed in claim 1, wherein a material of the first lower electrode or the second lower electrode comprises indium tin oxide.

* * * * *